(12) United States Patent
Cho et al.

(10) Patent No.: US 8,164,137 B2
(45) Date of Patent: Apr. 24, 2012

(54) MULTIPLE-GATE MOS TRANSISTOR USING SI SUBSTRATE AND METHOD OF MANUFACTURING THE SAME

(75) Inventors: Young Kyun Cho, Daejeon (KR); Tae Moon Roh, Daejeon (KR); Jong Dae Kim, Daejeon (KR)

(73) Assignee: Electronics and Telecommunication Research Institute, Daejeon (KR)

( * ) Notice: Subject to any disclaimer, the term of this patent is extended or adjusted under 35 U.S.C. 154(b) by 194 days.

(21) Appl. No.: 12/556,666

(22) Filed: Sep. 10, 2009

(65) Prior Publication Data

US 2010/0019321 A1 Jan. 28, 2010

Related U.S. Application Data

(62) Division of application No. 11/447,786, filed on Jun. 6, 2006, now Pat. No. 7,605,039.

(30) Foreign Application Priority Data

Sep. 27, 2005 (KR) .................... 10-2005-0089718

(51) Int. Cl.
*H01L 29/66* (2006.01)
*H01L 21/02* (2006.01)

(52) U.S. Cl. .............. 257/329; 257/344; 257/E29.264
(58) Field of Classification Search ........... 257/E29.264, 257/329, 344
See application file for complete search history.

(56) References Cited

U.S. PATENT DOCUMENTS

| 6,583,469 B1* | 6/2003 | Fried et al. ............ 257/329 |
| 2005/0035391 A1* | 2/2005 | Lee et al. ............ 257/308 |
| 2005/0051825 A1* | 3/2005 | Fujiwara et al. ........ 257/308 |
| 2005/0145932 A1* | 7/2005 | Park et al. ............ 257/328 |
| 2005/0153485 A1* | 7/2005 | Ahmed et al. .......... 438/142 |

* cited by examiner

*Primary Examiner* — Matthew Landau
*Assistant Examiner* — Daniel Luke
(74) *Attorney, Agent, or Firm* — Ladas & Parry LLP

(57) ABSTRACT

Provided are a multiple-gate MOS (metal oxide semiconductor) transistor and a method of manufacturing the same. The transistor includes a single crystalline active region having a channel region having an upper portion of a streamlined shape (∩) obtained by patterning an upper portion of a bulk silicon substrate with an embossed pattern, and having a thicker and wider area than the channel region; a nitride layer formed at both side surfaces of the single crystalline active region to expose an upper portion of the single crystalline active region at a predetermined height; and a gate electrode formed to be overlaid with the exposed upper portion of the single crystalline active region of the channel region.

11 Claims, 10 Drawing Sheets

MULTIPLE-GATE MOS TRANSISTOR USING SI SUBSTRATE AND METHOD OF MANUFACTURING THE SAME

CROSS-REFERENCE TO RELATED APPLICATION

This application claims priority from and the benefit of Korean Patent Application No. 2005-89718, filed on Sep. 27, 2005, the disclosure of which is herein incorporated by reference in its entirety.

BACKGROUND OF INVENTION

1. Field of the Invention

The present invention relates to a multiple-gate MOS transistor using a silicon substrate and a method of manufacturing the same, and more particularly, to a multiple-gate metal oxide semiconductor field effect transistor (MOSFET) in which a channel region having a nano-sized linewidth is connected to a substrate, and a streamline-shaped (∩) channel and a source and a drain having reduced series resistance are provided, and a method of manufacturing the same.

2. Discussion of Related Art

As semiconductor device manufacturing technology develops, devices are being scaled down in size and endeavors for increasing their operation speed to improve performance are being made. Accordingly, today, even a metal oxide semiconductor field effect transistor (MOSFET), a fundamental electronic device, is being continuously scaled down in size. However, in a general MOSFET, if a channel length is reduced to 100 nm or less, device on/off control ability based on a gate voltage is reduced due to a so-called short channel effect.

In order to overcome this drawback, a double-gate structure in which gate electrodes are formed at both sides of a channel region through which current flows has been proposed. In the double-gate structure, since the gate electrodes are formed at both sides of the channel region, current control ability in the channel region based on a gate voltage is greatly improved, thereby suppressing the short channel effect and providing the advantage of further miniaturized device. Further, a "wrap-around" gate structure or a "surround" gate structure, which is an extension of the concept of the double-gate structure, has been proposed. In this gate structure as well, a control ability based on a gate voltage is improved.

In a field effect transistor of an ideal double-gate structure, front and rear gates, and even source and drain, are self-aligned. Therefore, parasitic resistance is reduced. In recent years, a FinFET having a double-gate structure with a self-aligned gate has been developed using an unaltered conventional semiconductor process. This has the advantage of high compatibility with conventional planar structure semiconductor technology.

FIG. 1 is a perspective view illustrating a conventional double-gate FinFET.

A silicon on insulator (SOI) substrate having a stacked structure including a silicon layer 10, a buried oxidation layer 11, and a single crystalline silicon layer 12 is used. A single crystalline silicon pattern having a Fin structure is obtained by patterning the single crystalline silicon layer 12, and defines source and drain regions 12a, a channel region 12b, and an extension region 12c. The channel region 12b and the extension region 12c between the source and drain regions 12a are formed to be narrower than the source and drain regions 12a.

A mask pattern 13 for preventing concentration of electric field and channel formation is formed on the single crystalline silicon pattern having the channel region 12b, a gate oxide layer 14 is formed on a surface of the single crystalline silicon pattern, and a gate electrode 15 is formed on an oxide layer 11 and the gate oxide layer 14 disposed on the channel region 12b.

However, there are drawbacks in that, since the double-gate FinFET is manufactured on the SOI substrate, manufacturing cost is much higher than when manufactured on a bulk silicon substrate, and an off-current is increased, thereby causing poor thermal conduction. And, since a device is not connected with the substrate, a floating-body effect is caused, thereby deteriorating performance of the device.

In order to overcome these drawbacks, a double-gate FinFET device using a bulk silicon substrate has been proposed.

FIG. 2 is a perspective view illustrating a conventional double-gate FinFET using a bulk silicon substrate.

The proposed double-gate FinFET uses a bulk silicon substrate 20, and includes an active region having a Fin structure connected to a top and center of the bulk silicon substrate 20 and formed of single crystalline silicon; a first oxide layer 24 formed up from the surface of the bulk silicon substrate to a predetermined height with respect to the Fin active region 26; a nitride layer 27 thickly formed outside of the first oxide layer 24; a gate oxide layer 21 surrounding the Fin active region; a second oxide layer 28 formed outside of the nitride layer 27; a gate 25 formed on the first and second oxides 24 and 28; and source/drain regions 22a formed at both sides of the Fin active region 26 except where the Fin active region 26 overlaps the gate 25.

Since the FinFET uses a bulk wafer, it is inexpensive to manufacture, and since the Fin active region 26 having a silicon structure is connected with the substrate 20, not only can the drawback of the floating-body effect be solved, but device characteristics can be improved as well owing to good thermal conduction.

However, in the double-gate FinFET using the bulk silicon substrate, there are technological limitations to overcome. The same limitations also apply to the double-gate device using the SOI substrate of FIG. 1. Therefore, it is very important to overcome these limitations as stated below.

First, in order to manufacture a FinFET having stable operation characteristics, the width of the channel region should be no more than about half the length of the gate. In order to form such a channel width, nano patterning technology is required. Accordingly, delicate photolithography technology or technology such as ashing and trimming is required. When general electron-beam photolithography technology is used, the channel region undergoes a relatively large change in width, thereby increasing relative deviation of device characteristics and also lowering throughput. When the channel width is determined using ashing and trimming technology, uniformity is greatly diminished.

Second, when the Fin structure having the single crystalline silicon pattern is formed, it is not only difficult to form the silicon pattern, but also, since the channel region of the Fin structure is formed to have a rectangular shape, a corner effect of top corners storing charges due to a local concentration of electric field, thereby deteriorating device reliability.

Third, since the source and drain extension region is formed to have the same thickness and width as the channel region, parasitic resistance is high and thus a current driving ability of the device is remarkably reduced. In order to solve this problem, an elevated source/drain structure in which single crystalline silicon or silicon germanium (SiGe) is epitaxially grown at the source and drain regions has been introduced. But such a structure has the drawback of requiring complex processing.

SUMMARY OF THE INVENTION

The present invention is directed to implementation of using a bulk silicon substrate, forming a channel having a small width through a selective thermal oxidation of the channel, and streamlining the channel in shape (∩), thereby improving device reliability and electrical characteristics.

The present invention is also directed to implementation of embodying an extension region ranging from a channel to a source and a drain in a gradually increasing shape, using a selective thermal oxidation process, thereby reducing a parasitic resistance, and self-forming an elevated source/drain structure, thereby improving current driving ability of a device.

One aspect of the present invention provides a multiple-gate MOS (metal oxide semiconductor) transistor including: a single crystalline active region having a channel region having an upper portion of a streamlined shape (∩) obtained by patterning an upper portion of a bulk silicon substrate to have an embossed pattern, and having a thicker and wider area than the channel region; a nitride layer formed on both side surfaces of the single crystalline active region to expose an upper portion of the single crystalline active region at a predetermined height; and a gate electrode formed to be overlaid with the channel region of the exposed upper portion of the single crystalline active region.

The embossed pattern may be formed to have at least one multi-layer structure gradually narrowing as going up the silicon substrate.

The embossed pattern may include: a first single crystalline active region formed to be narrower than the silicon substrate on the silicon substrate; and a second single crystalline active region formed to be narrower than the first single crystalline active region on the first single crystalline active region.

The single crystalline active region may include: the channel region connected with the silicon substrate, and having the upper portion of the streamlined shape (∩); an extension region connected to both sides of the channel region, and gradually increasing in area as going outside; and source and drain regions connected to both sides of the extension region, and having thicker and wider areas than the channel region and the extension region.

Another aspect of the present invention provides a method of manufacturing a multiple-gate MOS (metal oxide semiconductor) transistor, the method including: a first step of forming a single crystalline silicon active region having an embossed pattern on a bulk silicon substrate, using an etching process; a second step of forming a first oxide layer and a first nitride layer on a surface of a single crystalline active region; a third step of patterning the first nitride layer to expose a portion of the first oxide layer being a channel region and an extension region of the single crystalline active region, by performing photolithography and etching processes using a predetermined mask; a fourth step of forming a thermal oxide layer of a field oxide layer type having a bird's beak, on the channel region and the extension region; a fifth step of removing the thermal oxide layer and the first nitride layer exposed at portions of the channel region and the extension region; a sixth step of forming a second oxide layer and a second nitride layer on the channel region of the exposed single crystalline silicon pattern; a seventh step of dry etching the second nitride layer and the second oxide layer at a predetermined height and then, forming a gate insulating layer on a surface of the exposed single crystalline active region; an eighth step of forming a gate electrode on the gate insulating layer; and a ninth step of implanting ions into the single crystalline active region having source and drain regions.

The first step may include: forming a first single crystalline active region on the bulk silicon substrate, by performing photolithography and etching processes; and forming a second single crystalline active region on the first single crystalline active region, by performing photolithography and etching processes.

In the first step, the second single crystalline active region may be formed to have a smaller thickness than the first single crystalline active region, and have a multi-layer shape (凸)gradually narrowing in the upward direction.

The etching process of the first step may be one of a photolithography process, a photoresist ashing process, and a hard mask oxide trimming process.

The first oxide layer may be formed to have different thicknesses from each other on a top surface and both side surfaces of the single crystalline active region.

The formed channel region of the fourth step may have any one of a streamlined shape (∩), and a trapezoid shape where a top width is less than a bottom width.

The seventh step may further include: before forming the gate insulating layer, forming a sacrificial oxide layer so as to clean sidewalls of the channel region and repair damage caused by an earlier process; and after removing the sacrificial oxide layer, annealing the resultant in an atmosphere of nitrogen or argon.

The gate insulating layer may be formed of one of a silicon oxide layer, a nitride layer, and a high-k insulating layer.

The method may further include the step of, before performing the ion implanting of the ninth step, forming a spacer at sidewalls of the gate electrode.

In the forming of the gate electrode of the eighth step, after the thermal oxide layer is formed, the thermal oxide layer may be dry etched using the first nitride layer as a mask without removing all of the first nitride layer and the thermal oxidation layer, and an insulating layer spacer may be formed on a sidewall of the first nitride layer, thereby forming a self-aligned gate.

The first insulating layer may be formed by depositing low-k insulating material having an excellent etch selectivity using a chemical vapor deposition method or an atomic layer deposition method.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art.

Figure 3A:
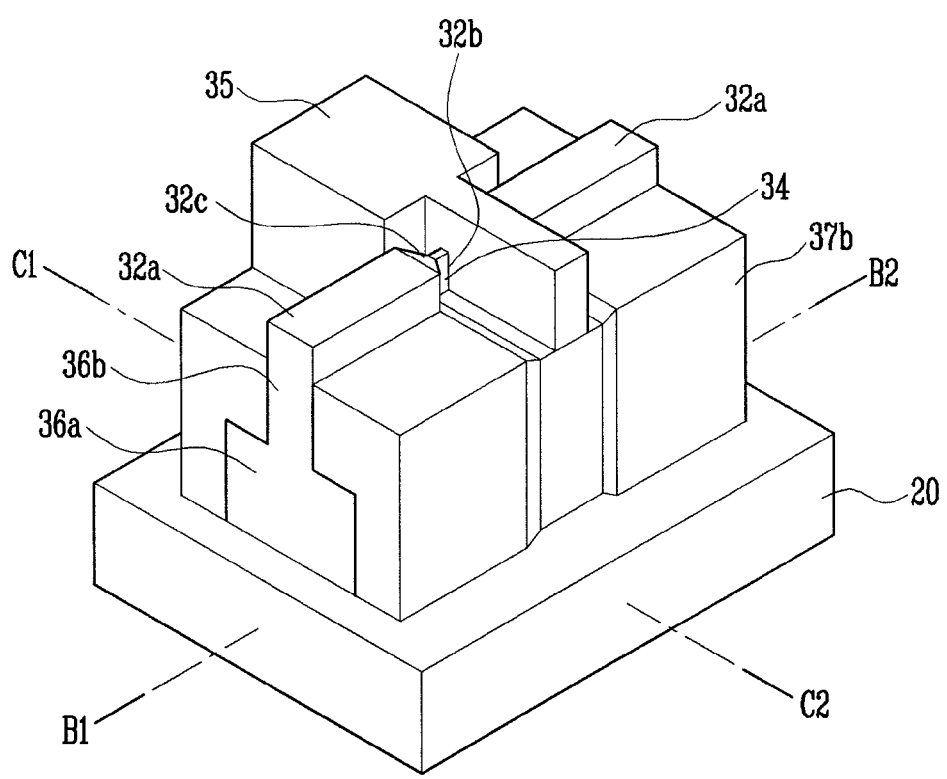
FIG. 3A is a perspective view illustrating a multiple-gate MOS transistor according to an embodiment of the present invention.
Figure 3B:
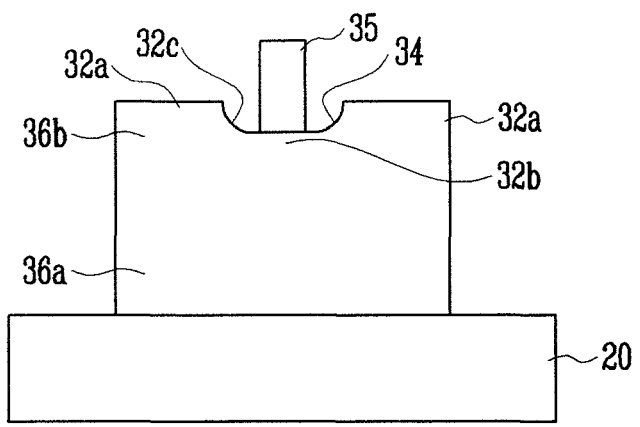
FIGS. 3B and 3C are cross-sectional views taken along lines B1-B2 and C1-C2 of FIG. 3A, respectively.
Figure 3C:
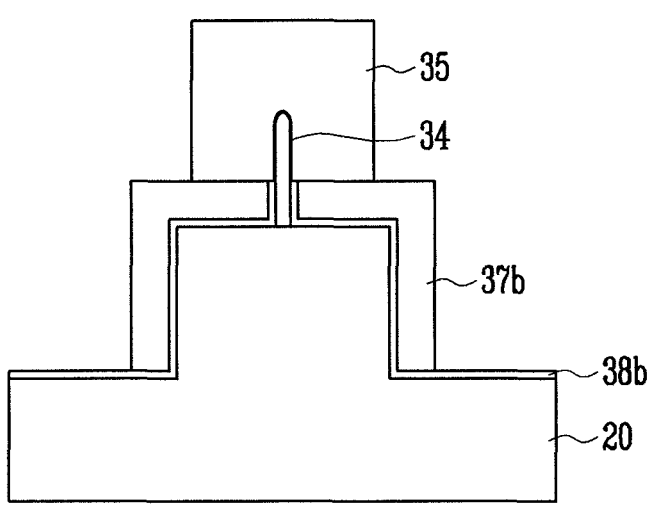

FIG. 3A is a perspective view illustrating a multiple-gate MOS transistor according to an embodiment of the present invention, FIG. 3B is a cross-sectional view taken along line B1-B2 of FIG. 3A, and FIG. 3C is a cross-sectional view taken along line C1-C2 of FIG. 3A.

Referring to FIGS. 3A to 3C, a first single crystalline active region 36a and a second single crystalline active region 36b are formed to have a multi-layer structured embossed pattern (凸)gradually narrowing in the upward direction, by patterning an upper portion of a bulk silicon substrate 20. The first single crystalline active region 36a preferably has a width of 0.1 μm to 0.5 μm and a height of 0.11 μm to 0.4 μm, and the second single crystalline active region 36b preferably has a width of 0.1 μm to 0.3 μm and a height of 0.25 μm to 0.5 μm.

Figure 9:
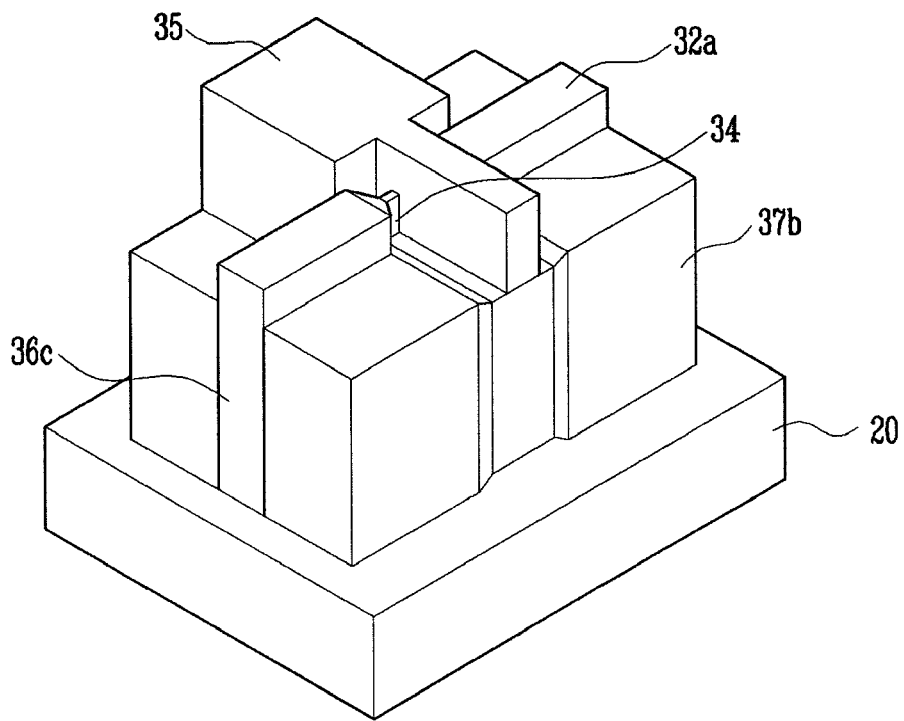
FIGS. 9 and 15 are perspective views illustrating multiple-gate MOS transistors according to other embodiments of the present invention.

In another embodiment according to the present invention, as shown in FIG. 9, the first and second single crystalline active regions 36a and 36b may also be constructed as a third single crystalline active region 36c of the same size having a single-layer structured embossed shape (□). In this case, the third single crystalline active region 36c preferably has a width of 0.1 μm to 0.3 μm and a height of 0.25 μm to 0.5 μm.

Further, the first, second, and third single crystalline active regions 36a, 36b, and 36c may be constructed in a trapezoid shape, a rectangular shape, and a streamline shape.

Each of the first, second, and third single crystalline active regions 36a, 36b, and 36c includes source and drain regions 32a, a channel region 32b formed between the source and drain regions 32a, and an extension region 32c connecting each of the source and drain regions 32a with the channel region 32b.

The first and second single crystalline active regions 36a and 36b or the third single crystalline active region 36c having the channel region 32b is connected to the underlying silicon substrate 20, and has a streamlined shape (∩) at its upper portion. The first, second, and third single crystalline active regions 36a, 36b, and 36c are formed to gradually increase in area as going to the source and drain regions 32a. The source and drain regions 32a of the first, second, and third single crystalline active regions 36a, 36b, and 36c are formed to be thicker and wider than the channel region 32b and the extension region 32c of the first, second, and third single crystalline active regions 36a, 36b, and 36c.

In addition, a second nitride layer 37b is formed on both lateral surfaces of the first and second single crystalline active regions 36a and 36b or the third single crystalline active region 36c to expose an upper portion of the second single crystalline active region 36b or the third single crystalline active region 36c at a predetermined height.

Preferably, the second nitride layer 37b has a thickness of 200 nm, and the height of the exposed upper portion of the second or third single crystalline active region 36b or 36c is half or less than the total height of the second or third single crystalline active region 36b or 36c.

Further, a gate electrode 35 is overlaid on the exposed channel region 32b in the second or third single crystalline active region 36b or 36c.

In this case, the gate electrode 35 may also be partially overlaid with the extension region 32c.

A method of manufacturing the above-constructed multiple-gate MOS transistor according to the present invention will be in detail described with reference to the accompanying drawings below.

FIGS. 4 to 8 are perspective views illustrating a method of manufacturing a multiple-gate MOS transistor using a silicon substrate according to an embodiment of the present invention.

Figure 4:
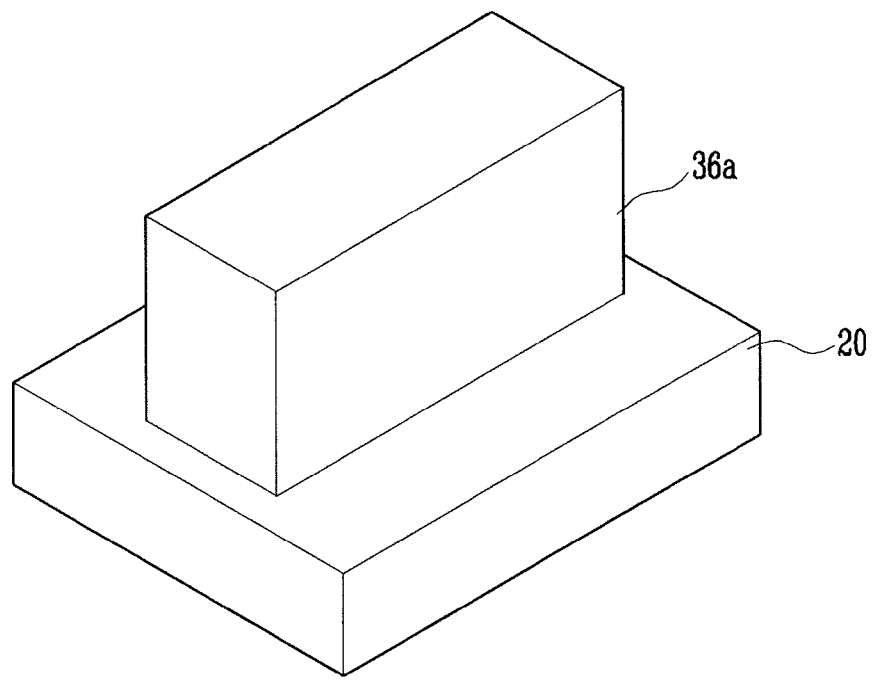
FIGS. 4 to 8 are perspective views illustrating a method of manufacturing a multiple-gate MOS transistor using a silicon substrate according to an embodiment of the present invention.

First, as shown in FIG. 4, a first single crystalline active region 36a is formed on a bulk silicon substrate 20 using photolithography and etching processes.

In this case, when the first single crystalline active region 36a is too large in width, leakage current can increase and depletion cannot be completely made in a channel bottom region, thereby causing a floating-body effect. Therefore, the first single crystalline active region 36a having a suitable thickness should be provided. Accordingly, the first single crystalline active region 36a preferably has a width of 0.1 μm to 0.5 μm and a height of 0.1 μm to 0.4 μm.

Figure 5:
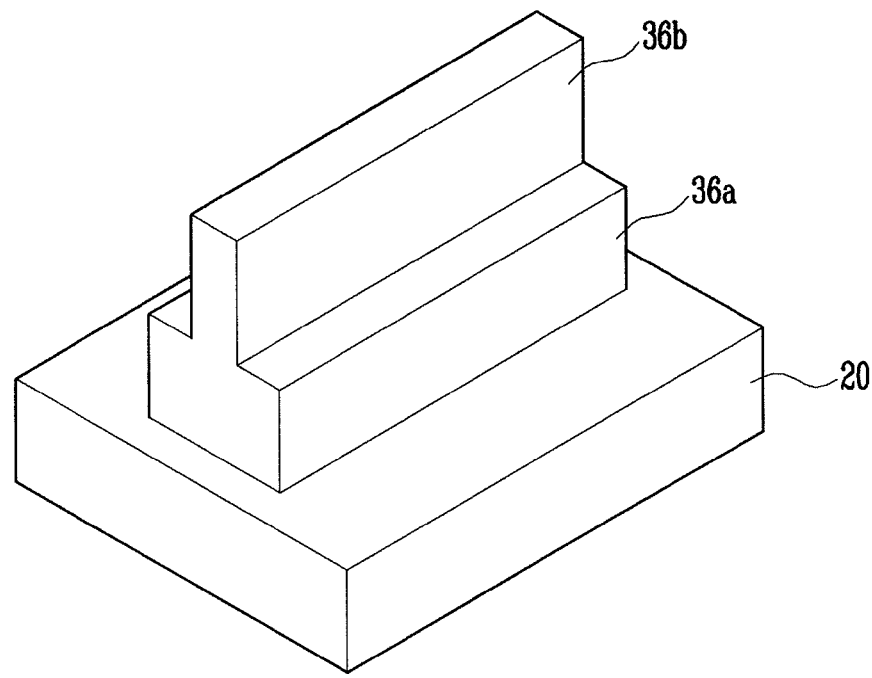

Subsequently, as shown in FIG. 5, the photolithography and etching processes are once more performed to pattern the first single crystalline active region 36a, thereby forming a second single crystalline active region 36b on the first single crystalline active region 36a. In this case, the photolithography and etching processes can also be performed not to pattern the first single crystalline active region 36a but to pattern the bulk silicon substrate 20. But, in an embodiment of the present invention, the photolithography and etching processes are performed to pattern the first single crystalline active region 36a, thereby forming the second single crystalline active region 36b.

The second single crystalline active region 36b is formed thinner than the first single crystalline active region 36a. The first and second single crystalline active regions 36a and 36b are formed in a multi-layer structure (凸)gradually narrowing in the upward direction.

The second single crystalline active region 36b can also be formed in a trapezoid structure in which a top width is smaller than a bottom width, depending on an etching condition.

In forming the second single crystalline active region 36b, a photoresist ashing process and a hard mask oxide trimming method can be performed in addition to the photolithography and etching processes.

The width of the second single crystalline active region 36b determines widths of the source and drain regions 32a and the extension region 32c.

In other words, when the second single crystalline active region 36b increases in width, the source and drain regions 32a and the extension region 32c also increase in width, thereby reducing source/drain series resistance.

However, when the second single crystalline active region 36b too increases in size, a thermal oxidation process time taken to form a thin channel should be increased. As a result, there is a difficulty in forming a uniform channel. In forming the second single crystalline active region 36b, its thickness should be double or more than the height of the channel region 32b. This is to provide the same effect as a multiple-gate MOS transistor manufactured on a silicon-on-insulator (SOI) wafer, in which the channel region is formed and the second single crystalline active region 36b provided under the formed channel region is surrounded by an insulating layer such as a second nitride layer 37b.

Accordingly, the second single crystalline active region 36b can be preferably formed to have a width of 0.1 μm to 0.3 μm and a height of 0.25 μm to 0.5 μm.

As described above, the first and second single crystalline active regions 36a and 36b are connected to the bulk silicon substrate without floating the silicon active regions, thereby improving device characteristics. In other words, since the channel region 32b is connected to the silicon substrate 20, a drawback of the floating-body effect is prevented, thereby allowing heat generated from the channel region to be easily dissipated to the silicon substrate 20 in comparison with the device manufactured on the SOI substrate.

Additionally, in the present invention, when the first and second single crystalline active regions 36a and 36b are formed in a multi-layer structure (f'ʰ)gradually narrowing in the upward direction, a single crystalline silicon layer can be more easily adjusted in width and height through photolithography and etching processes, thereby effectively controlling a shape of the channel region 32b to be formed.

Figure 6:
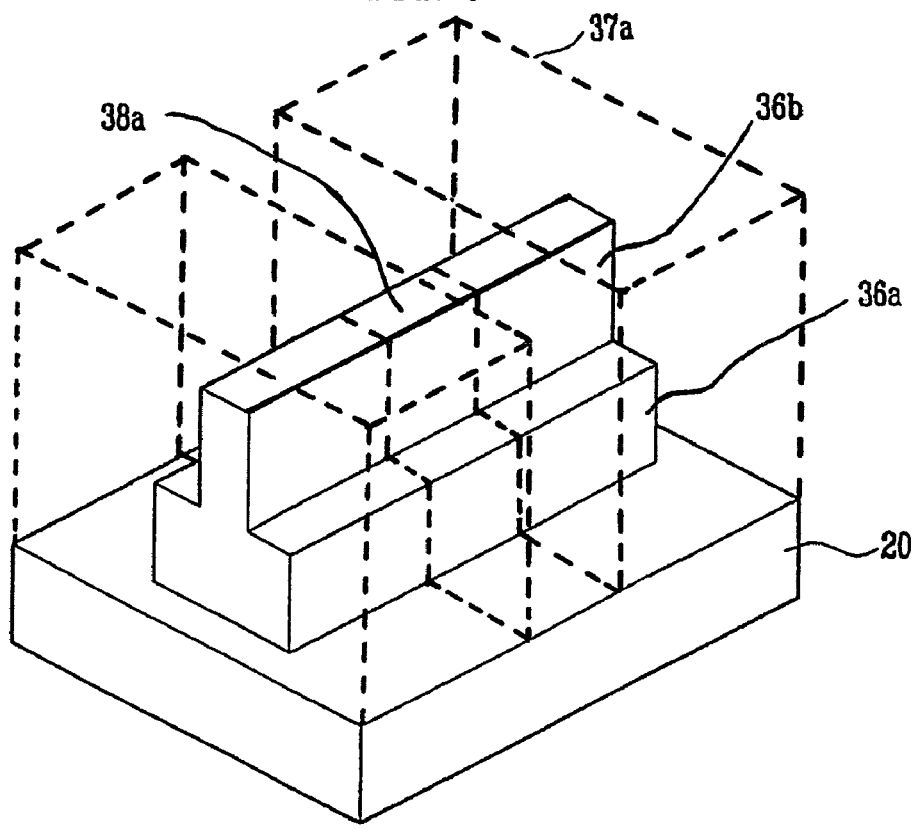

Subsequently, as shown in FIG. 6, a first oxide layer 38a is formed on surfaces of the first and second single crystalline active regions 36a and 36b. The first oxide layer 38a can be formed by a chemical vapor deposition (CVD) method or an atomic layer deposition (ALD) method. Because the first oxide layer 38a is thin enough to be neglected, it is not illustrated in detail in FIG. 6.

Further, in order to obtain various channel structures, the first oxide layer 38a can be formed to have thicknesses different from each other on top surfaces and both side surfaces of the first and second single crystalline active regions 36a and 36b and also, a nitride layer (not shown) can be formed on side surfaces of lower portions of the first and second single crystalline active regions 36a and 36b, thereby suppressing a thermal oxidation layer from being formed on the side surfaces of the lower portions.

Subsequently, a first nitride layer 37a is formed to a predetermined thickness on the first oxide layer 38a. The first nitride layer 37a can be formed by a CVD method or an ALD method.

The first nitride layer 37a is patterned to expose the first oxide layer 38a at portions of the channel region and the extension region of the first and second single crystalline active regions 36a and 36b, by performing photolithography and etching processes using a predetermined mask. To illustrate the patterning of the first nitride layer 37a, the first nitride layer 37a is shown to be transparent in FIG. 6, such that the underlying first and second single crystalline active regions 36a and 36b are clearly visible through the first nitride layer 37a.

In this case, according to a gap formed by patterning the first nitride layer 37a, the channel region 32b and the source and drain extension regions 32c are determined in length. In other words, when the gap is too wide, the source and drain extension regions 32c are lengthened. As a result, the source/drain parasitic resistance cannot be effectively reduced. Accordingly, the gap is preferably formed to have a width similar to the length of a gate to be formed.

In addition, with reference to FIGS. 6, the portion of the first oxide layer 38a that is exposed (i.e., the portion of the first oxide layer that is not concealed by the first oxide layer 37a) is thermally oxidized, thereby forming a thermal oxide layer (not shown with detail in FIG. 6).

In this case, the thermal oxide layer is grown by performing a wet thermal oxidation process at a high temperature of 900° C. or more. However, in order to improve interface characteristics of the first and second single crystalline active regions 36a and 36b and the thermal oxide layer, a dry thermal oxidation process and a wet thermal oxidation process can also be performed in sequence.

Unlike the oxide layer, the nitride layer does not allow passage of oxygen and vapor. Therefore, the thermal oxide layer is grown only on a portion where the first nitride layer 37a does not exist, i.e., on some portions of the channel region and the extension region.

In this case, owing to a density difference between the thermal oxide layer and the first and second single crystalline active regions 36a and 36b, about 45% of a thermal oxide layer is grown under the first nitride layer 37a. Accordingly, as the thermal oxide layer is formed as a field oxide type having a bird's beak, the single crystalline silicon patterns 36a and 36b change into a bone type.

Meanwhile, when the first oxide layer 38a is very thin and the first nitride layer 37a is very thick, the first oxide layer 38a can be removed despite a high etch selectivity between the first nitride layer 37a and the first oxide layer 38a. In this case, when the first oxide layer 38a is re-grown by the CVD method or the ALD method and then the wet thermal oxidation process is performed, such a drawback can be solved.

After the thermal oxidation process is performed, the first nitride layer 37a and the thermal oxide layer are removed.

Figure 7:
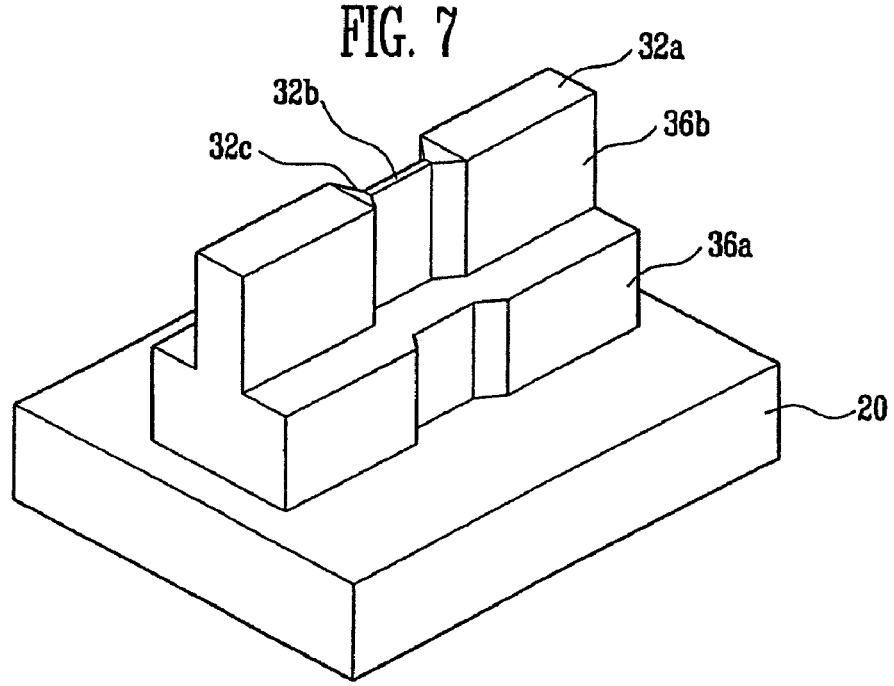

Accordingly, when the first nitride layer 37a and the thermal oxide layer are removed from the first and second single crystalline active regions 36a and 36b, the resultant first and second single crystalline active regions 36a and 36b remain as shown in FIG. 7.

In other words, the width of the upper portion of the channel region 32b is narrower than that of its lower portion and has a streamlined shape (∩) and, in the extension region 32c, a thermal oxide layer is grown only on the surface of the first oxide layer 38a exposed by the thermal oxidation process. Since the thermal oxide layer is not grown under the first nitride layer 37a, the width and height (area) of the single crystalline active regions are gradually increased as going to the source and drain regions 32a. The source and drain regions 32a are thicker than the channel region 32b and the extension region 32c, i.e., have elevated source and drain structures.

In the elevated source/drain structure, the source/drain parasitic resistance can be effectively reduced, and a current crowding effect at the drain region can be prevented owing to the region gradually increasing in width.

According to the present invention, not only the thin and high channel region 32b having a streamlined shape but also the self-formed elevated source and drain structures can be provided.

Alternatively, in forming the channel region, conditions (temperature, time, and etching condition) of the thermal oxidation process are controlled so that the channel region 32b can be formed to have not only the streamlined shape (∩) but also a trapezoid shape with an upper portion narrower than the lower portion or other shapes.

For example, a difference between growth speeds of the first oxide layer 38a depending on crystal orientations of the first and second single crystalline active regions 36a and 36b can be used to minutely control the thickness of the channel.

In other words, when an SOI substrate having a parallel orientation is used, the upper portion of the single crystalline silicon pattern has a parallel plane orientation, and therefore is thermally oxidized at a lower speed than at side surface portions having a vertical plane orientation. Accordingly, a silicon oxide layer is grown thicker at both sides of the channel region having the vertical plane orientation, and therefore a thinner Fin structure can be formed. During the thermal oxidation process, the thermal oxide layer is grown at the upper portion and the side surface portions of the single crystalline silicon pattern of the channel region. Therefore, the upper portion of the single crystalline silicon pattern can be formed in the streamlined shape (∩) owing to the overlay of the thermal oxide layer.

When the upper portion is formed in the streamlined shape (∩), a corner portion is not formed at the upper portion. Consequently, a concentration of an electric field can be prevented, thereby avoiding a corner effect caused by electron accumulation and improving device reliability and endurance.

Since the above processes of the present invention are physically and stably performed, the channel region of the first and second single crystalline active regions 36a and 36b are not collapsed.

Figure 8:
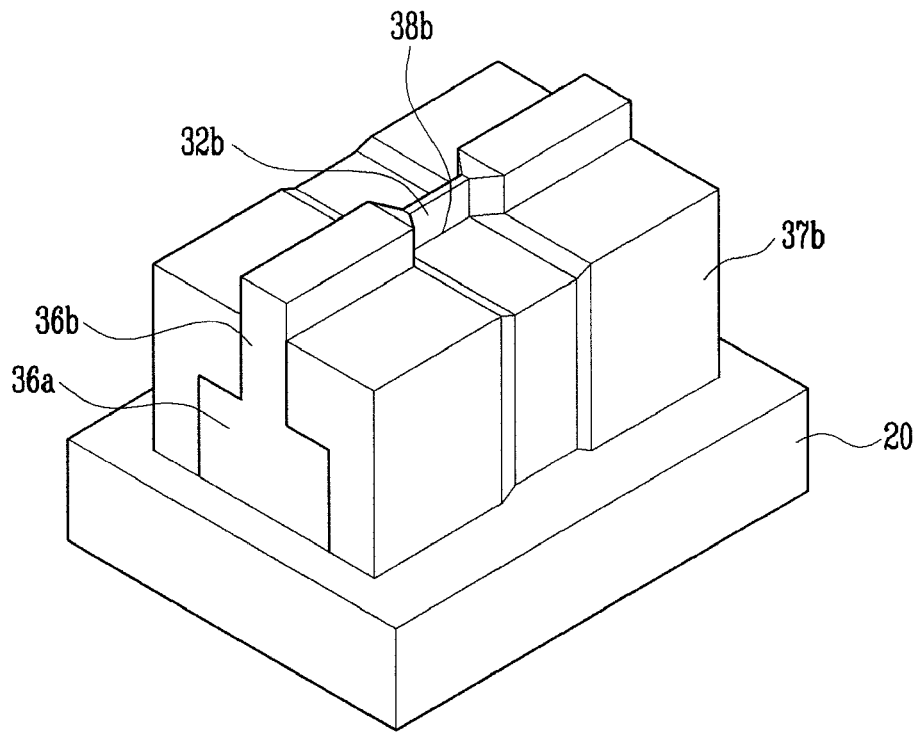

Subsequently, as shown in FIG. 8, a second oxide layer 38b is formed on the first and second single crystalline active regions 36a and 36b, and then a second nitride layer 37b is formed thick on the second oxide layer 38b. In this case, the second oxide layer 38b has a thickness of 10 nm to 20 nm, and the second nitride layer 37b has a thickness of about 200 nm.

The second nitride layer 37b is etched by about 50 to 150 nm from an uppermost to a lower portion of the channel region through a dry etching process, to expose a portion of the second single crystalline active region 36b. The exposed second single crystalline active region 36b serves as the channel region 32b of the device, and the height of the exposed channel region preferably is half or less than the second single crystalline active region 36b.

Meanwhile, a chemical-mechanical polishing (CMP) process can also be performed to form the channel region, but the present invention has an advantage capable of forming the channel region even without the CMP process.

Figure 10A:
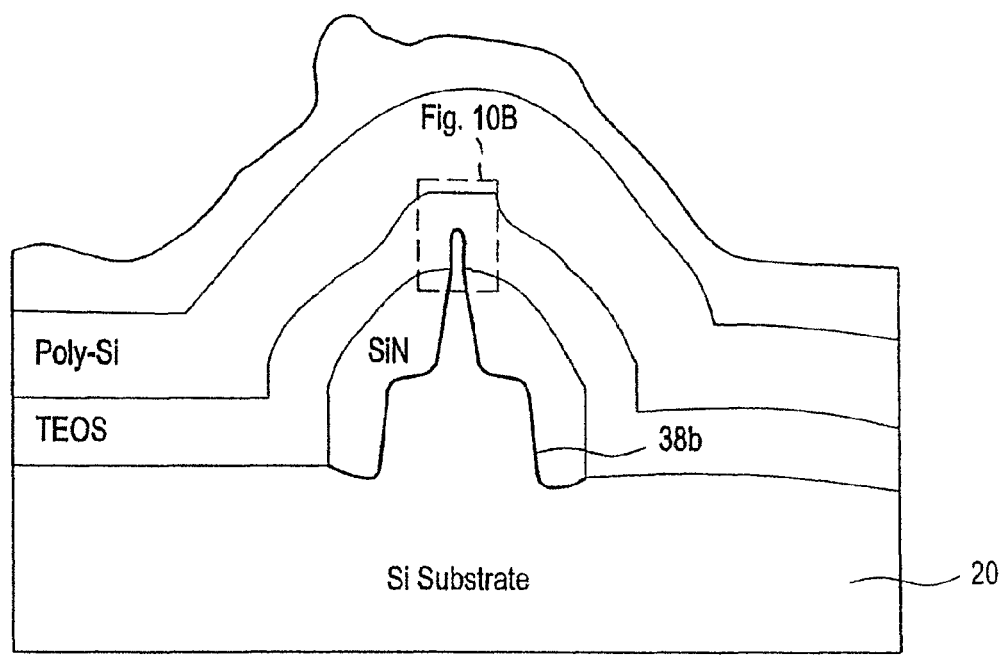
FIGS. 10A-10B show an experimental result illustrating a process of forming a channel region according to an embodiment of the present invention.
Figure 10B:
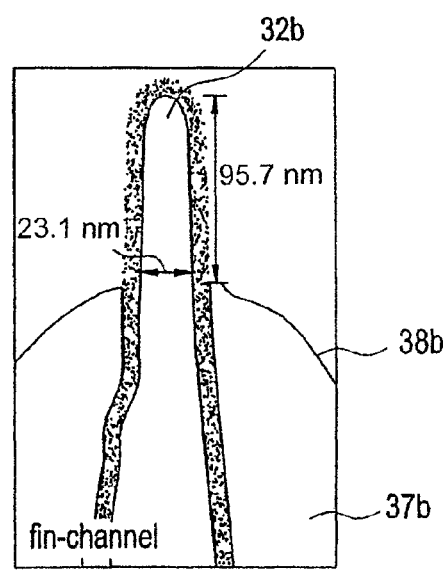
Figure 11:
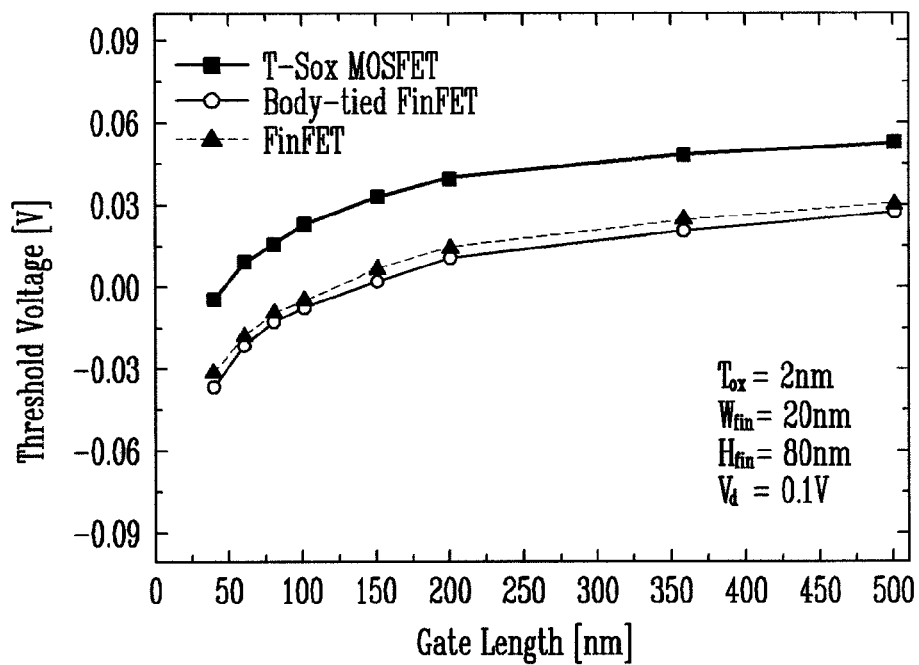
FIGS. 11 to 14 are comparative graphs of electrical characteristics measured through simulation.
Figure 12:
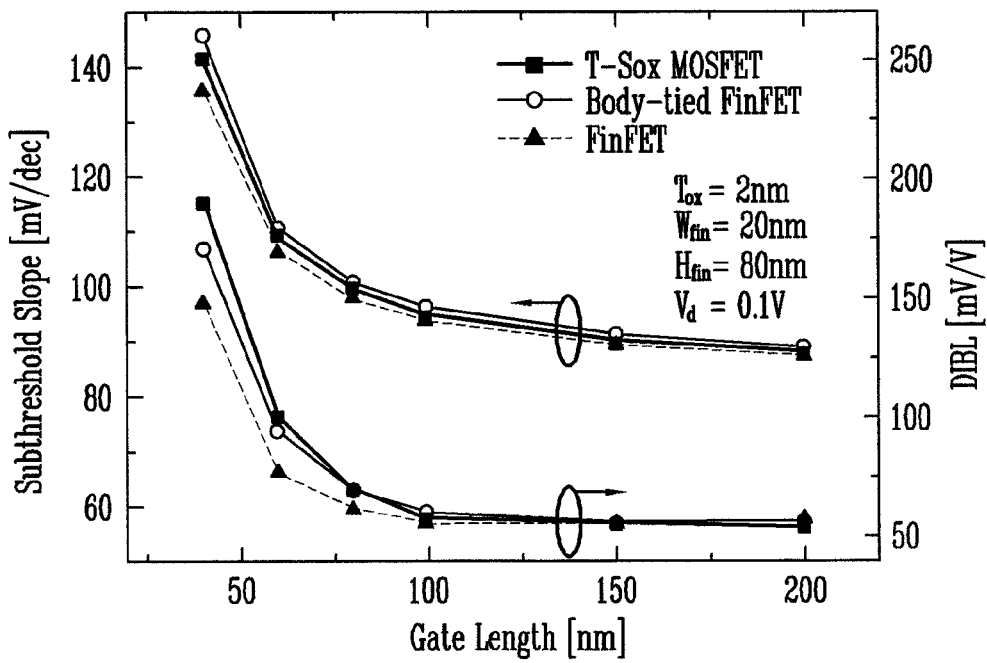
Figure 13:
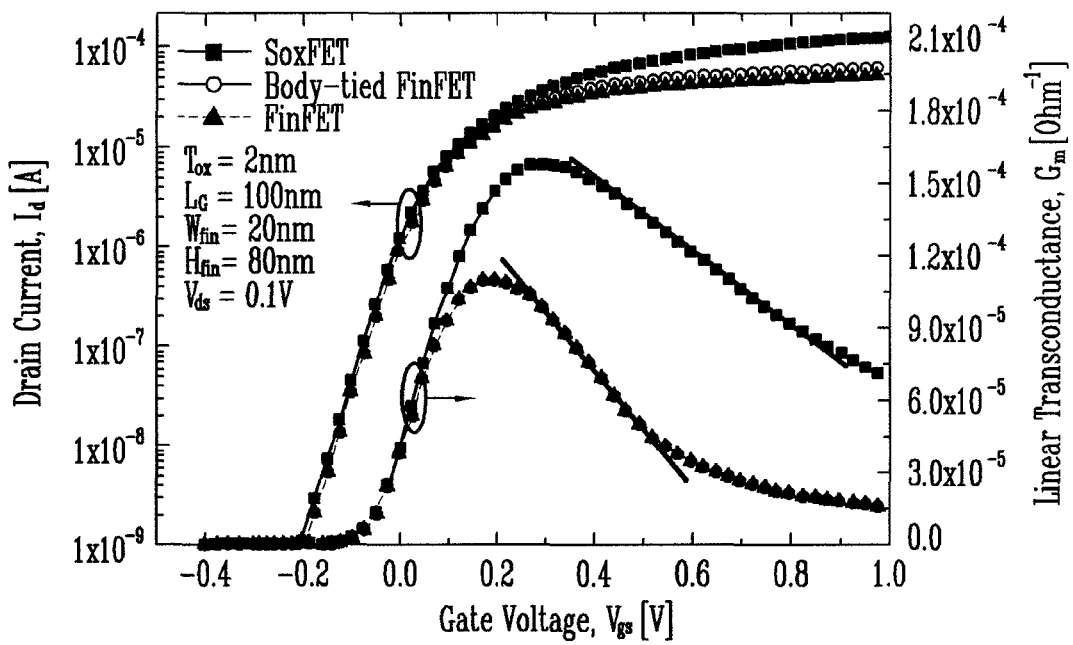
Figure 14:
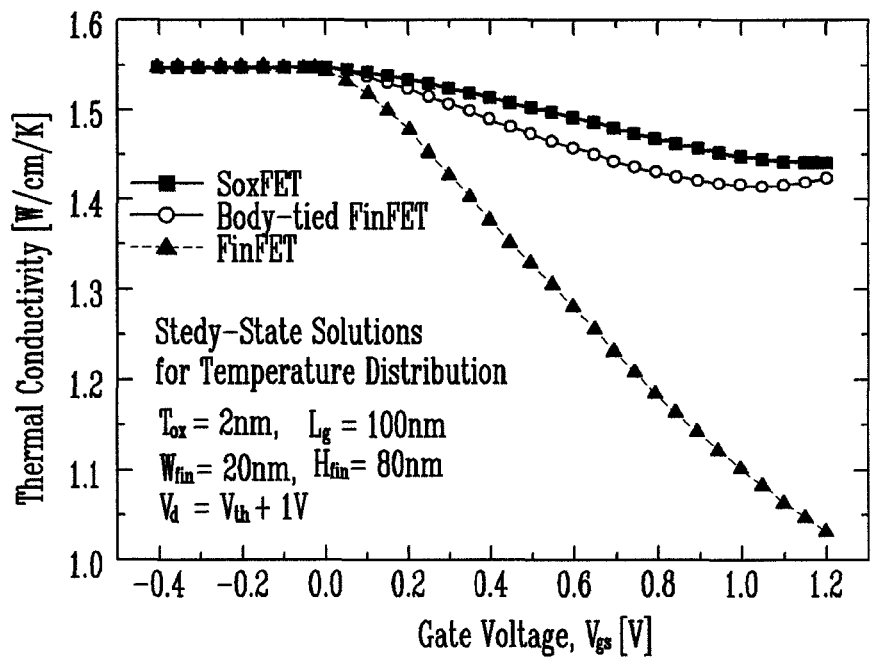
Figure 15:
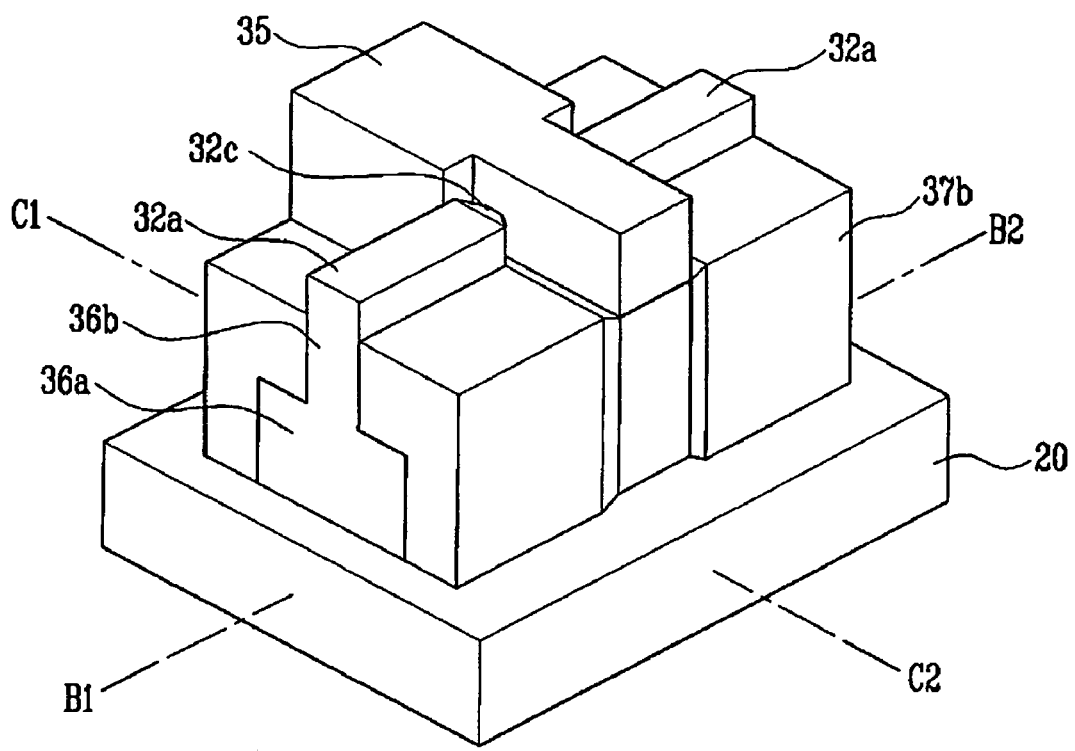

In order to form a gate insulating layer 34 on the channel region 32b, the second nitride layer 37b is etched by the dry etching process, and then the second oxide layer 38b covering the channel region is removed by a wet etching process. Experimental results of the above description are shown in FIGS. 10A-10B.

Further, as a resultant structure according to this invention is shown in FIG. 9, the gate insulating layer 34 is formed on the channel region 32b of the first and second single crystalline active regions 36a and 36b.

In this case, before the gate insulating layer 34 is formed, in order to clean sidewalls of the channel region 32b and cure damage caused by the previous process, a sacrificial oxide layer is formed, and then removed. Thereafter, an annealing process is preferably performed in an atmosphere of nitrogen or argon.

The gate insulating layer 34 can employ a silicon oxide layer, a nitride layer, or an insulating layer including a high-k dielectric layer.

In addition, a conductive layer is formed of a P-type or N-type polysilicon layer, a P-type or N-type silicon germanium (SiGe) layer, or a metal layer on the resultant structure, and thus a gate shape is provided.

Subsequently, a gate electrode 35 is formed by patterning the conductive layer, and performing the photolithography and etching process.

Further, high-concentration impurity ions are implanted into the source and drain regions 32a of the first and second single crystalline active regions 36a and 36b to form a source and a drain, thereby forming a multiple-gate field effect transistor.

In this case, before the implantation of the impurity ions, a spacer can be formed on the sidewall of the gate electrode 35 to minimize the overlay of the gate and the source and drain. After the implantation of the impurity ions, an annealing process is preferably performed to activate the dopants.

In another embodiment of the present invention, after the thermal oxide layer is formed, the thermal oxide layer can be dry etched using the first nitride layer 37a as a mask without removing all of the first nitride layer 37a and the thermal oxide layer, and an insulating layer spacer can be formed on a sidewall of the first nitride layer 37a to form a self-aligned gate. In this case, the insulating layer is obtained by depositing a low-k insulating material having an excellent etch selectivity using a CVD method or an ALD method, and the insulating layer spacer for defining the gate is formed by a drying etching process.

The thickness of the insulating layer spacer can be adjusted by the thickness of the first nitride layer 37a.

FIG. 9 illustrates a multiple-gate MOS transistor using a silicon substrate according to another embodiment of the present invention.

As shown in FIG. 9, instead of the first and second single crystalline active regions 36a and 36b formed to have the multi-layer structured embossed pattern (⊓)gradually narrowing in the upward direction, a third single crystalline active region 36c is formed to have a single-layer structured embossed pattern (□).

The third single crystalline active region 36c having the single-layer structured embossed pattern (□) can be easily formed by omitting the process of forming the first single crystalline active region 36a.

Figure 1:
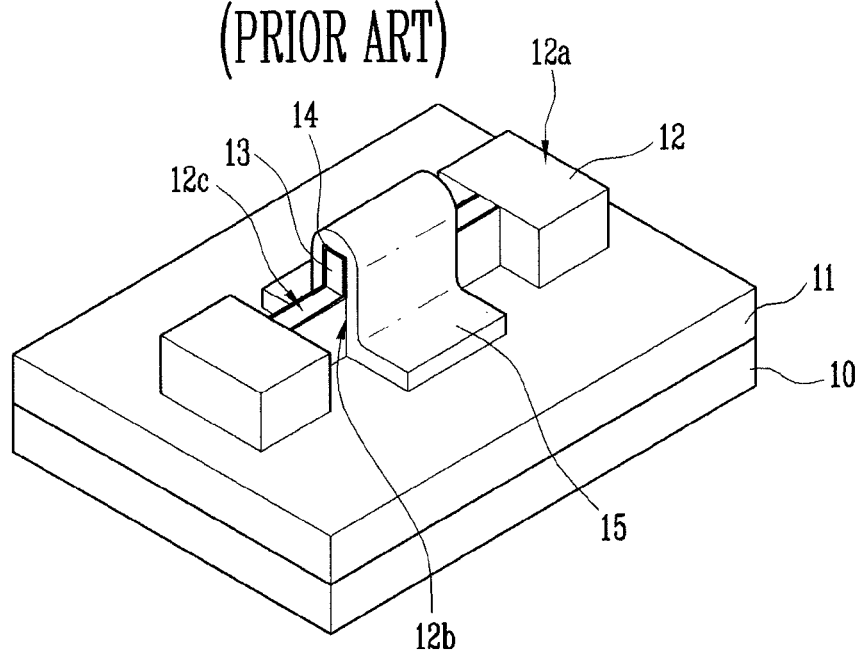
FIG. 1 is a perspective view illustrating a conventional double-gate FinFET.
Figure 2:
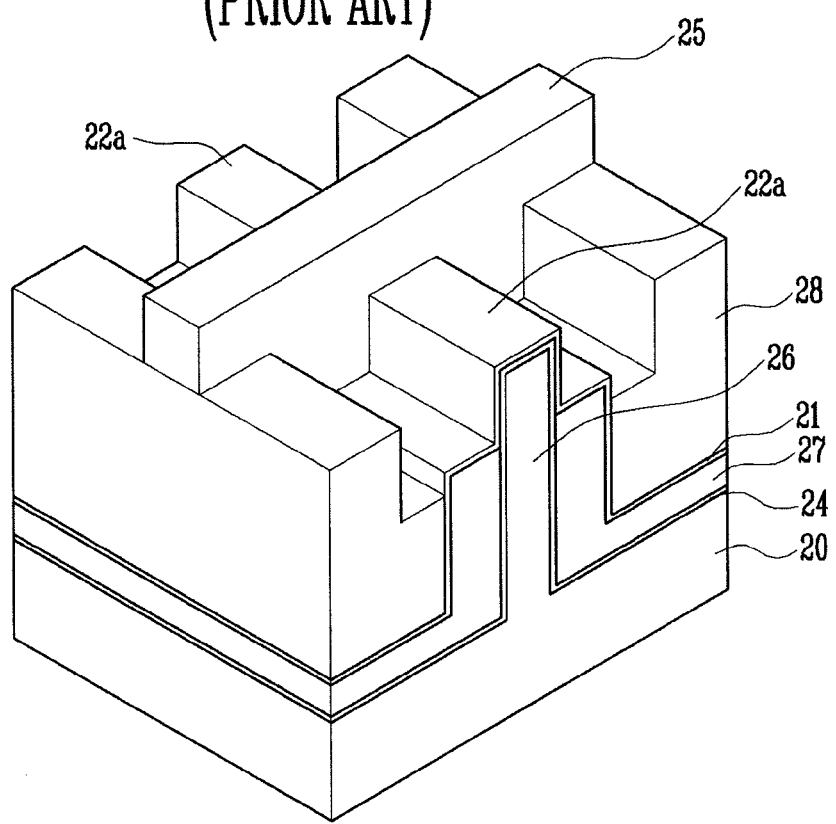
FIG. 2 is a perspective view illustrating a conventional double-gate FinFET using a bulk silicon substrate.

FIGS. 11 to 14 are comparative graphs of electrical characteristics of a multiple-gate MOS transistor according to this invention, and a conventional double-gate FinFET (FIG. 1) and a double-gate FinFET employing a bulk silicon substrate (FIG. 2).

As can be seen from the simulation results shown in FIGS. 11 to 14, the device according to this invention is excellent in thermal conductivity, linear transconductance, and current driving ability in comparison with the conventional devices, and shows characteristics of a short channel effect almost similar to the device using the SOI substrate.

As described above, a multiple-gate MOS transistor according to the present invention and its manufacturing method have the following effects.

First, since a bulk silicon substrate is used, excellent thermal conductivity is provided and drawbacks of a floating-body effect and a threshold voltage drop occurring between source and drain regions are effectively solved in comparison with a conventional multiple-gate MOS transistor using an SOI substrate.

Second, a channel region can be easily formed in a streamlined shape (∩) at an upper portion through a selective thermal oxidation process.

Third, since the channel region is formed in the streamlined shape (∩), device reliability is prevented from being deteriorated due to concentration of an electric field, and since a top surface and both sidewalls of the channel region are surrounded by a gate electrode, current driving ability depending on a gate voltage is excellent.

Fourth, since a multiple-gate MOS transistor has a structure of gradually increasing source and drain extension regions, a current crowding phenomenon is prevented, and since the source and drain regions are formed to have elevated source and drain structures resulting from the thermal oxidation process, source and drain series resistance is reduced and the current driving ability is enhanced.

Fifth, unlike a conventional art where a separate epitaxial layer forming process is performed to form the elevated source and drain structures, the present invention can easily realize the elevated source and drain structures even without a separate process, and does not need high photolithography technology for gate patterning since the gate electrode is formed by a self-alignment method.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A multiple-gate MOS (metal oxide semiconductor) transistor comprising:
    a single crystalline active region comprising a channel region having an upper portion of a streamlined curvilinear shape (∩) obtained by patterning an upper portion of a bulk silicon substrate to form an embossed pattern, and regions formed on two sides of the channel region to be thicker and wider than the channel region, and wherein the channel region is connected to the silicon substrate;
    a nitride layer formed on surfaces of the single crystalline active region to expose an upper portion of the single crystalline active region at a predetermined height; and
    a gate electrode formed to be overlaid on the channel region of the exposed upper portion of the single crystalline active region, wherein the single crystalline active region further comprises:
    a first extension region connected to a first side of the channel region and a second extension region connected to a second side of the channel region, each gradually increasing in thickness and width going away from the channel region; and
    source and drain regions connected to the first and second extension regions, respectively, and being thicker and wider than the channel region and the extension regions.

2. The multiple-gate MOS transistor according to claim 1, wherein the embossed pattern is formed to have at least one multi-layer structure gradually narrowing as going up the silicon substrate.

3. The multiple-gate MOS transistor according to claim 1, wherein the embossed pattern is formed to have at least one of a trapezoid shape, a rectangular shape, and a streamlined shape.

4. The multiple-gate MOS transistor according to claim 1, wherein the embossed pattern comprises:
    a first single crystalline active region formed narrower than the silicon substrate on the silicon substrate; and
    a second single crystalline active region formed narrower than the first single crystalline active region on the first single crystalline active region.

5. The multiple-gate MOS transistor according to claim 4, wherein the first single crystalline active region has a width of 0.1 μm to 0.5 μm and a height of 0.1 μm to 0.4 μm.

6. The multiple-gate MOS transistor according to claim 4, wherein the second single crystalline active region has a width of 0.1 μm to 0.3 μm and height of 0.25 μm to 0.5 μm.

7. The multiple-gate MOS transistor according to claim 1, wherein the single crystalline active region has a width of 0.1 μm to 0.3 μm and a height of 0.25 μm to 0.5 μm.

8. The multiple-gate MOS transistor according to claim 1, wherein the nitride layer has a thickness of 200 nm.

9. The multiple-gate MOS transistor according to claim 1, wherein the predetermined height of the exposed upper portion of the single crystalline active region is half or less than the total height of the single crystalline active region.

10. The multiple-gate MOS transistor according to claim 1, wherein the gate electrode is partially overlaid on an extension region.

11. A multiple-gate MOS (metal oxide semiconductor) transistor comprising:
    a silicon substrate;
    a first crystalline active region connected to the silicon substrate;
    a second crystalline active region connected to the first crystalline active region, the second crystalline active region comprising;
    a channel region formed between two opposing extension regions, wherein the channel region is connected to the silicon substrate and comprises an upper portion having a streamlined curvilinear shape, and wherein the extension regions are thicker and wider than the channel region;
    a source region connected to one extension region and a drain region connected to the opposing extension region, wherein the source and drain regions are thicker and wider than the extension regions, and wherein the source and drain regions include implanted high-concentration impurity ions,
    wherein the first crystalline active region is wider than the second crystalline active region and the silicon substrate is wider than the first crystalline active region;
    a nitride layer formed on surfaces of the first and second crystalline active regions to expose an upper portion of the first crystalline active region at a predetermined height; and
    a gate electrode overlaid on a portion of the channel region of the exposed upper portion of the first crystalline active region.

* * * * *